(12) United States Patent
Lim et al.

(10) Patent No.: US 8,232,138 B2
(45) Date of Patent: Jul. 31, 2012

(54) CIRCUIT BOARD WITH NOTCHED STIFFENER FRAME

(75) Inventors: Kevin W. Lim, Santa Clara, CA (US); Seah S. Too, San Jose, CA (US); Mohammad Z. Khan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 83 days.

(21) Appl. No.: 12/759,761

(22) Filed: Apr. 14, 2010

(65) Prior Publication Data

US 2011/0253428 A1  Oct. 20, 2011

(51) Int. Cl.
*H01L 21/00* (2006.01)
*H01L 23/48* (2006.01)
(52) U.S. Cl. .......... 438/108; 438/106; 257/E21.503; 257/E23.006; 257/688
(58) Field of Classification Search .......... 257/729, 257/702, 688, E21.503, E21.499, E23.006, 257/E21.511; 438/106, 108
See application file for complete search history.

(56) References Cited

U.S. PATENT DOCUMENTS

| | | | |
|---|---|---|---|
| 5,841,194 A * | 11/1998 | Tsukamoto | ............ 257/729 |
| 5,866,943 A | 2/1999 | Mertol | |
| 6,046,077 A | 4/2000 | Baba | |
| 6,114,763 A | 9/2000 | Smith | |
| 6,224,711 B1 | 5/2001 | Carden | |
| 6,313,521 B1 | 11/2001 | Baba | |
| 6,445,062 B1 | 9/2002 | Honda | |
| 6,509,630 B1 | 1/2003 | Yanagisawa | |
| 6,756,685 B2 | 6/2004 | Tao | |
| 6,944,945 B1 | 9/2005 | Shipley et al. | |
| 6,979,636 B1 | 12/2005 | Lin et al. | |
| 2001/0017408 A1 | 8/2001 | Baba | |
| 2002/0114144 A1 | 8/2002 | Kumamoto et al. | |
| 2003/0025180 A1 | 2/2003 | Alcoe et al. | |
| 2003/0178722 A1 | 9/2003 | Xie et al. | |
| 2004/0099958 A1 | 5/2004 | Schildgen et al. | |
| 2004/0150118 A1 | 8/2004 | Honda | |
| 2005/0230797 A1 | 10/2005 | Ho et al. | |
| 2005/0282310 A1 | 12/2005 | Zhou | |
| 2006/0208356 A1 | 9/2006 | Yamano et al. | |
| 2006/0249852 A1 | 11/2006 | Chiu et al. | |
| 2008/0001308 A1 | 1/2008 | Chen | |
| 2008/0054490 A1 | 3/2008 | McLellan et al. | |

(Continued)

FOREIGN PATENT DOCUMENTS

JP  09283889  10/1997

(Continued)

OTHER PUBLICATIONS

U.S. Appl. No. 12/435,147, filed May 4, 2009, Stephen Heng et al.

(Continued)

*Primary Examiner* — Walter L Lindsay, Jr.
(74) *Attorney, Agent, or Firm* — Timothy M. Honeycutt

(57) ABSTRACT

Various embodiments of a semiconductor chip device that include a circuit board and a stiffener frame and methods of fabricating the same are disclosed. In one aspect, a method of manufacturing is provided that includes providing a circuit board and coupling a stiffener frame to the circuit board. The stiffener frame includes a first opening that defines an interior wall. The interior wall includes a notch.

20 Claims, 6 Drawing Sheets

U.S. PATENT DOCUMENTS

| | | |
|---|---|---|
| 2008/0142996 A1 | 6/2008 | Subramanian et al. |
| 2008/0284047 A1 | 11/2008 | Tosaya |
| 2009/0200659 A1 | 8/2009 | Tosaya et al. |
| 2009/0236730 A1 | 9/2009 | Topacio |
| 2010/0052188 A1 | 3/2010 | Khan et al. |

FOREIGN PATENT DOCUMENTS

| | | |
|---|---|---|
| JP | 3161706 | 8/2000 |
| JP | 3180794 | 4/2001 |
| JP | 3189270 | 5/2001 |
| JP | 3219043 | 8/2001 |
| JP | 3228339 | 9/2001 |
| JP | 2002190560 | 7/2002 |
| JP | 3367554 | 11/2002 |
| JP | 3384359 | 12/2002 |
| JP | 3385533 | 1/2003 |
| JP | 2003051568 | 2/2003 |
| JP | 3459804 | 8/2003 |
| JP | 2004260138 | 9/2004 |
| JP | 200767010 | 3/2007 |

OTHER PUBLICATIONS

Horatio Quinones et al.; *Flip chip Encapsulation Reliability*; ASYMTEK; Aug. 1998; pp. 1-13.

Richard Blish, Ph.D.; *Use Condition Based Reliability Evaluation of New Semiconductor Technologies*; SEMATECH; Aug. 31, 1999; pp. 1-24.

National Electronics Center of Excellence; *Empfasis-Lead Free Soldering for Sustainment*; A publication of the National Electronics Manufacturing Center for Excellence; http://www.empf.org/empfasis/oct03/3403pbsustain.htm; Mar./Apr. 2003; pp. 1-3.

K.C. Norris et al.; *Reliability of Controlled Collapse Interconnections*; IBM J. Res. Development; May 1969; pp. 1-6.

Werner Engelmaier; *Solder Joints in Electronics: Design for Reliability*; 1999; pp. 1-13.

\* cited by examiner

CIRCUIT BOARD WITH NOTCHED STIFFENER FRAME

BACKGROUND OF THE INVENTION

1. Field of the Invention

This invention relates generally to semiconductor processing, and more particularly to circuit board stiffener frames and methods of making the same.

2. Description of the Related Art

Many current integrated circuits are formed as multiple semiconductor chips on a common silicon wafer. After the basic process steps to form the circuits on the semiconductor chips are complete, the individual semiconductor chips are cut or singulated from the wafer. The singulated semiconductor chips are then usually mounted to structures, such as circuit boards, or packaged in some form of enclosure.

One frequently-used package consists of a substrate upon which a semiconductor chip is mounted. The upper surface of the substrate includes conductive pads. The semiconductor chip is manufactured with a plurality of bump pads. A collection of solder joints are provided between the bump pads of the semiconductor chip and the corresponding conductive pads of the package substrate to establish ohmic contact. After the semiconductor chip is seated on the substrate, a reflow process is performed to enable the solder bumps of the semiconductor chip to metallurgically link to the solder pads of the substrate.

For conventional semiconductor chip packages, there may be significant differences in the coefficients of thermal expansion (CTE) of the semiconductor chip, the package substrate and the solder joints. Large differences in CTE coupled with thermal stresses associated with testing and operation can imposed significant strains on solder joints. To lessen the effects of differential CTE, an underfill material is often deposited between the semiconductor chip and the package substrate to act as a material that inhibits damage to the solder bumps due to mismatches in CTE.

One conventional type of substrate consists of a core laminated between upper and lower build-up layers. The core itself usually consists of four layers of glass filled epoxy. The build-up layers, which may number four or more on opposite sides of the core, are formed from some type of resin. Various metallization structures are interspersed in the core and build-up layers in order to provide electrical pathways between pins or pads on the lowermost layer of the substrate and pads that bond with the chip solder bumps.

The core provides a certain stiffness to the substrate. Even with that provided stiffness, conventional substrates still tend to warp due to mismatches in the CTE's for the semiconductor chip, the underfill and the package substrate.

One conventional technique for addressing package substrate warpage involves the use of a stiffener ring on the semiconductor chip side of the package substrate. Some conventional stiffener rings are made of metallic materials, while others are formed from plastics. Regardless of composition, a typical conventional stiffener ring includes a central opening to accommodate the semiconductor chip while leaving a gap. The gap is used to dispense the aforementioned underfill. Underfill is conventionally dispensed in the gap as a dot or a line. After dispensing, capillary action draws the underfill into the space between the semiconductor chip and the package substrate. Both line and dot dispensing may be readily performed where the stiffener frame and the semiconductor chip are sized to provide a sizeable gap. However, various design choices may lead to a relatively small gap, such as where a package substrate happens to be quite flexible and requires a stiffener frame with an extensive footprint, and the semiconductor chip has a large footprint. It may be difficult to efficiently introduce underfill in a small gap. Another issue raised by narrow chip-to-stiffener frame gaps is the propensity for underfill to flow around semiconductor chip corners more readily than into the space between the semiconductor chip and the package substrate. Densely packed flip-chip solder joints tend to retard the capillary flow of underfill. If the underfill is initially dispensed at an edge of the semiconductor chip where the flip-chip solder joints are densely packed, then the underfill will tend to more readily flow around the semiconductor chip corners and leave the space between the semiconductor chip and the package substrate with insufficient underfill or even voids.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes providing a circuit board and coupling a stiffener frame to the circuit board. The stiffener frame includes a first opening that defines an interior wall. The interior wall includes a notch.

In accordance with another aspect of an embodiment of the present invention, a method of manufacturing is provided that includes providing a semiconductor chip package substrate and coupling a stiffener frame to the semiconductor chip package substrate. The stiffener frame includes a first opening that defines an interior wall. The interior wall includes a notch.

In accordance with another aspect of an embodiment of the present invention, an apparatus is provided that includes a circuit board and a stiffener frame coupled to the circuit board. The stiffener frame includes a first opening that defines an interior wall. The interior wall includes a notch.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip device are described herein. One example includes a semiconductor chip mounted on a circuit board. A stiffener frame is coupled to the circuit board and includes an opening to accommodate the semiconductor chip. The opening defines an interior wall that includes a notch. The notch provides a space to accommodate an underfill material and an underfill applicator if desired. Underfill dispensed in the notch is encouraged to flow between the semiconductor chip and the circuit board. Additional details will now be described.

Figure 1:
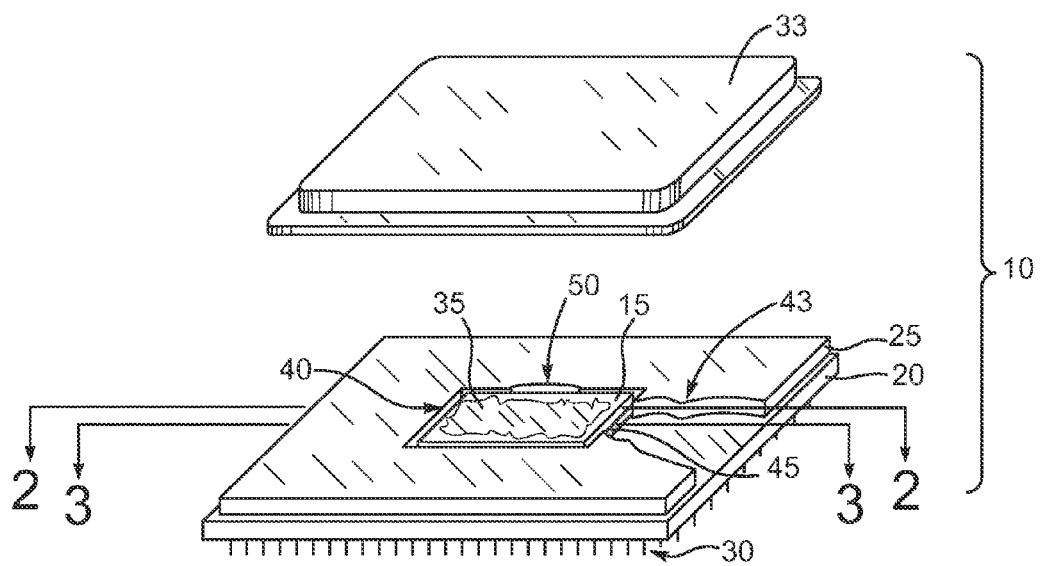
FIG. 1 is a partially exploded pictorial view of an exemplary embodiment of a semiconductor chip device that includes a semiconductor chip mounted to a circuit board.

In the drawings described below, reference numerals are generally repeated where identical elements appear in more than one figure. Turning now to the drawings, and in particular to FIG. 1 is a partially exploded pictorial view of an exemplary embodiment of a semiconductor chip device 10 that includes a semiconductor chip 15 mounted to a circuit board 20. The semiconductor chip 15 is surrounded peripherally by a stiffener frame 25 that is coupled to the circuit board 20 and, as the name implies, designed to stiffen the circuit board 20 against bending stresses. To facilitate electrical interface with some other device (not shown), the circuit board 20 may be provided with an interconnect system, which in this illustrative embodiment consists of a pin grid array 30. However, the skilled artisan will appreciate that other types of interconnect structures such as ball grid arrays, land grid arrays or other interconnect systems may be used as well. Furthermore, if the circuit board 20 is not slated for mounting to another circuit board or device, then no interconnect system need be used.

An optional lid or heat spreader 33 (shown exploded) may be seated on the stiffener frame 25 directly or by way of some intermediary structure (not shown). The lid 33 may be a top hat design as depicted or virtually any other heat spreader configuration such as a bathtub lid, a planar heat spreader or other type of heat spreader. Optionally, the circuit device 10 need not include any type of covering device or heat spreader. To facilitate heat transfer between the semiconductor chip 15 and the lid 33, a thermal interface material 35 may be applied to the semiconductor chip 15 and/or the undersurface (not shown) of the lid 30. The thermal interface material 35 may be an organic or metallic type thermal interface material. Examples include various silicone thermal greases or gels, solders utilizing indium or other metallic materials or the like.

The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core. Multiple planar and/or stacked dice may be used. The semiconductor chip 15 may be fabricated using silicon, germanium or other semiconductor materials. If desired, the semiconductor chip 15 may be fabricated as a semiconductor-on-insulator substrate or as bulk semiconductor.

The circuit board 20 may be configured as a semiconductor chip package substrate, a circuit card, a motherboard or virtually any type of circuit board. Various materials may be used, such ceramics or organic materials as desired. If organic, the circuit board 20 may be monolithic or consist of multiple layers of metallization and dielectric materials. The circuit board 20 may interconnect electrically with external devices, such as a socket, in a variety of ways, such as the depicted pin grid array 30, or optionally a land grid array, a ball grid array or other configuration. The number of individual layers for the circuit board 20 is largely a matter of design discretion. In certain exemplary embodiments, the number of layers may vary from two to sixteen. If such a build-up design is selected, a standard core, thin core or coreless arrangement may be used. The dielectric materials may be, for example, epoxy resin with or without fiberglass fill. The circuit board 20 may be provided with one or more passive devices (not shown), which may be capacitors, resistors, inductors or other components.

The lid 33 may be composed of well-known plastics, ceramics or metallic materials as desired. Some exemplary materials include nickel plated copper, anodized aluminum, aluminum-silicon-carbide, aluminum nitride, boron nitride or the like. In an exemplary embodiment, the lid 33 may consist of a nickel plated copper.

The stiffener frame 25 may be fabricated from a variety of materials, such as polymers, ceramics, metallic materials, composites of metals and ceramics or the like. Examples of polymer materials include moldable plastics, epoxies or the like. Examples of metallic materials include copper, aluminum, nickel, stainless steel, titanium, aluminum, various combinations of these or the like. The stiffener frame 25 may be coupled to the circuit board in a variety of ways. Solders or adhesives may be used to join the stiffener frame 25 to the circuit board 20. Optionally, the stiffener frame 25 can be molded directly on the circuit board 20 on an individual basis or en masse on multiple instances of the circuit board 20.

The stiffener frame 25 includes an opening 37 that defines an interior wall 39. The opening 37 is sized to accommodate the semiconductor chip 15 while leaving a narrow gap 40. A portion of the stiffener frame 25 is shown cut away at 43 to reveal a portion of an underfill material layer 45 that protrudes slightly from the edge of the semiconductor chip 15 and continues into the space (not shown) between the semiconductor chip 15 and the circuit board 20. To facilitate the application of the underfill material 45, the interior wall 39 is provided with a notch 50. A technical purpose of the notch 50 is to facilitate the strategic deposition of underfill material 45 proximate an edge of the semiconductor chip 15 in such a way that underfill material 45 is encouraged to flow more readily beneath the semiconductor chip 15 by way of capillary forces. The opening 37 and the notch 39 may be formed at the same time the stiffener frame 25 is fabricated, such as by suitable molding or casting. Optionally, the opening 37 and the notch 39 may be formed by material removal, such as by laser cutting, water milling, sawing, chemical etching or the like. In this illustrative embodiment, the notch 50 has an oval footprint. However, different shapes, such as rectangular, v-shaped, trapezoidal or others may be used. More than one notch 50 could also be used.

Figure 2:
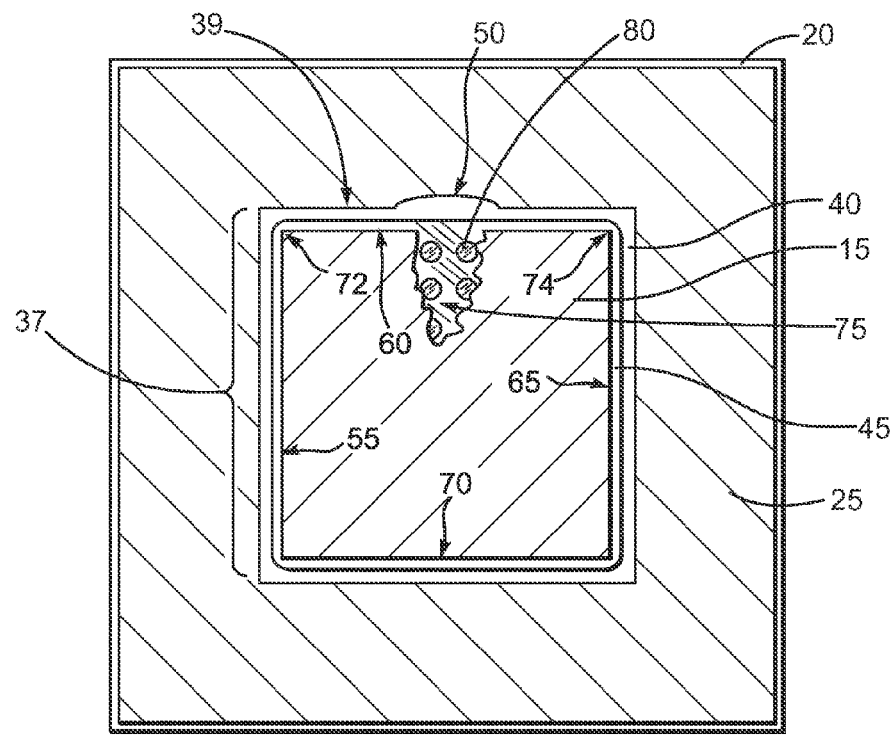
FIG. 2 is a sectional view of FIG. 1 taken at section 2-2.
Figure 3:
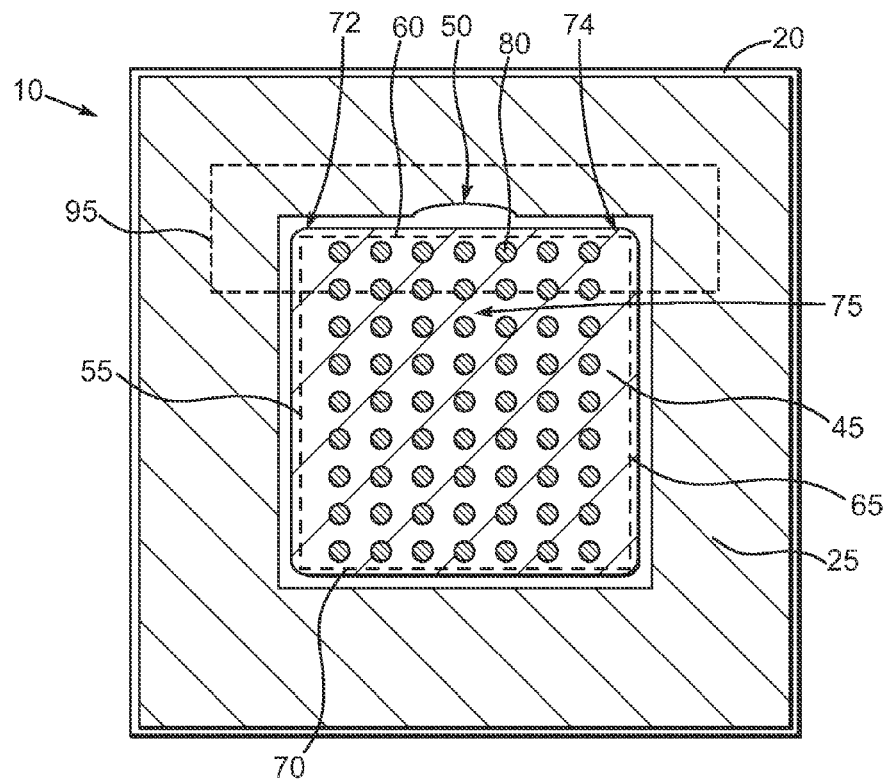
FIG. 3 is a sectional view of FIG. 1 taken at section 3-3.

Additional details of the semiconductor chip device 10 and in particular the stiffener frame 25 and the notch 50 may be understood by referring now to FIGS. 2 and 3. Before proceeding in depth with FIGS. 2 and 3, it should be noted that FIG. 2 is a sectional view of FIG. 1 taken at section 2-2 and that section 2-2 cuts through the semiconductor chip 15 but not the underlying underfill 45, while FIG. 3 is a sectional view taken at section 3-3 where section 3-3 does cut through the underlying underfill 45 but not the overlying semiconductor chip 15. With that brief backdrop, attention is now turned to FIG. 2. Note that in FIG. 2, the stiffener frame 25 is not shown cut away and is slightly less than fully contiguous with the circuit board 20. However, the skilled artisan will appreciate that the stiffener frame 25 could be fully contiguous with the circuit board 20 as desired. As noted above, a portion of the underfill material 45 is visible as a bead that extends around the four edges 55, 60, 65 and 70 of the semiconductor chip 15. The intersections of the edges 55 and 60 and 60 and 65 define two chip corners 72 and 74. A portion of the semiconductor chip between the two corners 72 and 74 is cut away to reveal a portion of the underfill 45 in the vicinity of an interior portion 75 of the space between the semiconductor chip 15 and the circuit board 20. Plural interconnect structures 80 are positioned between and electrically interconnect the semiconductor chip 15 and the circuit board 20. The interconnect structures may be solder joints, conductive pillars with or without solder enhancements or other types of structures. If configured as solder joints, lead-based or lead-free solders or combinations of the two may be used.

It is desirable to fabricate the stiffener frame 25 with as small a gap 40 between the edges 55, 60, 65 and 70 of the chip 15 and the interior wall 39 as possible so that the strengthening properties of the frame 25 cover the maximum amount of circuit board 20. However, with a narrow gap 40 the dispensing of the underfill 45, particularly if dot dispensing is preferred, may be problematic. Accordingly, the notch 50 provides a small but important opening in which underfill material 45 may be dot dispensed so that the underfill 45 may readily proceed towards the interior 75 between the chip 15 and the circuit board 20. Here, the notch 50 is fabricated with a generally oval or semicircular shape. However, and as described in subsequent paragraphs and shown in subsequent figures, the notch 50 may take on a variety of shapes.

Attention is now turned to FIG. 3, which is a sectional view of the semiconductor chip device 10. Here, the semiconductor chip 15 visible in FIGS. 1 and 2 is not visible due to the location of section 3-3. However, the entirety of the underfill material 45 is now visible along with plural interconnect structures 80 that interconnect the circuit board 20 to the semiconductor chip 15 (see FIGS. 1 and 2). Although the semiconductor chip 15 is not visible in FIG. 3 due to the location of section 3-3, it will be useful to show in dashed lines the locations of the edges 55, 60, 65 and 70 and corners 72 and 74 of semiconductor chip 15 (see FIGS. 1 and 2) relative to the underfill 45. The underfill material 45 may be composed of well-known epoxy materials, such as epoxy resin with or without silica fillers and phenol resins or the like. Two examples are types 8437-2 and 2BD available from Namics. The number and arrangement of the interconnect structures 80 will depend upon available processing techniques as well as the complexity of the input/output locations for the semiconductor chip 15. Since the dispersal of the underfill 45 in and around the interconnect structures 80 relies heavily on capillary action, the density of the interconnects 80, that is, the number of interconnects 80 in a given area, has an impact on underfill dispersal. Higher interconnect densities tend to inhibit the capillary action and movement of the underfill 45 into the interior region 75 and thus tend to favor the movement of underfill around for example the corners 72 and 74.

Figure 4:
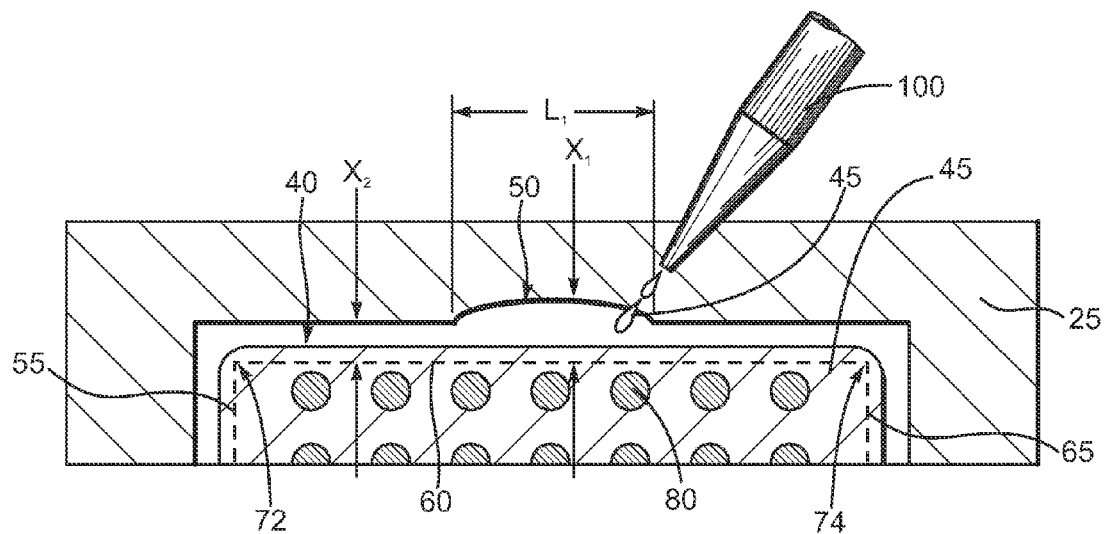
FIG. 4 is a portion of FIG. 3 shown at greater magnification.

The portion of FIG. 3 circumscribed by the dashed rectangle 95 will be shown at greater magnification in FIG. 4. Attention is now turned to FIG. 4. As noted above, the notch 50 is provided to facilitate the dispensing of underfill 45. The notch 50 may be positioned proximate a long side or short side of the semiconductor chip 15 as desired. Various tools may be used to deliver the underfill 45. In an exemplary embodiment, a jet nozzle 100 may be used to dot dispense the underfill 45 proximate the edge 60 of the semiconductor chip. The dimensions of the notch 50 may vary depending upon the size of the gap 40, the properties of the underfill 45, the size of the semiconductor chip as well as the density of the interconnects 80. In this illustrative embodiment, an oval shaped notch 50 may have a length, $L_1$, and a width defined by $X_1$-$X_2$ where $X_1$ is the distance between the edge 60 of the chip and the notch 50 at its widest point and $X_2$ is the width of the gap 40. In a particular embodiment, $L_1$ may be 6.0 millimeters, $X_1$ may be 3.0 millimeters and $X_2$ may be 1.5 millimeters.

Figure 5:
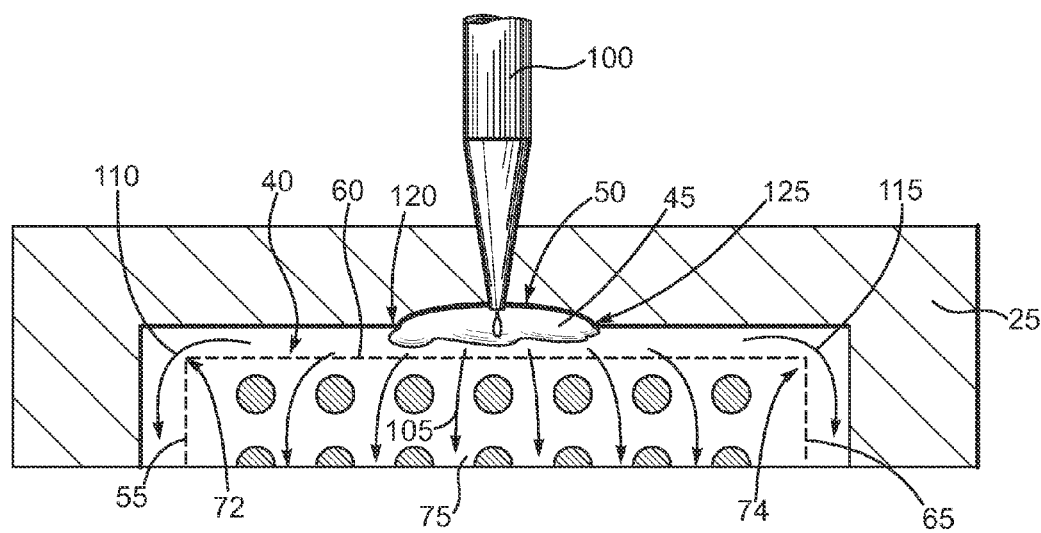
FIG. 5 is a sectional view like FIG. 4, but depicting application of an underfill material in an exemplary stiffener frame notch.

An exemplary dispensing of the underfill 45 may be understood by referring now to FIG. 5, which is a sectional view like FIG. 4, but depicts the initial stages of underfill dispensing. Here, the dispensing nozzle 100 positioned proximate the notch 50, and if need be inserted into the notch 50, and a dot of underfill 45 dispensed in the notch 50. The notch 50 serves at least three important functions. First, the notch 50 enables the insertion of the nozzle 50 into the relatively narrow gap 40. Second, the notch 50 provides a vessel to hold a volume of the underfill 45 that can readily proceed as indicated by the arrows 105 into the interior region 75 more readily than around the corners 72 and 74 as indicated by the arrows 110 and 115. Third, corners 120 and 125 of the notch 50 act as surface tension barriers that in essence retard the movement of the underfill 45 toward the corners 72 and 74 and the direction of the arrows 110 and 115. Again, a technical goal is to establish a flow gradient that favors movement of the underfill 45 towards the interior 75 versus the corners 72 and 74 as represented by the arrows 110 and 115. It may be desirable to make multiple dot dispenses in the notch 50 in order to provide an adequate volume of the underfill 45. It may also be possible to combine a dot dispense proximate the notch 50 along with another or multiple line dispenses around the edges 55, 60 and 65, i.e., the perimeter of the chip.

Figure 6:
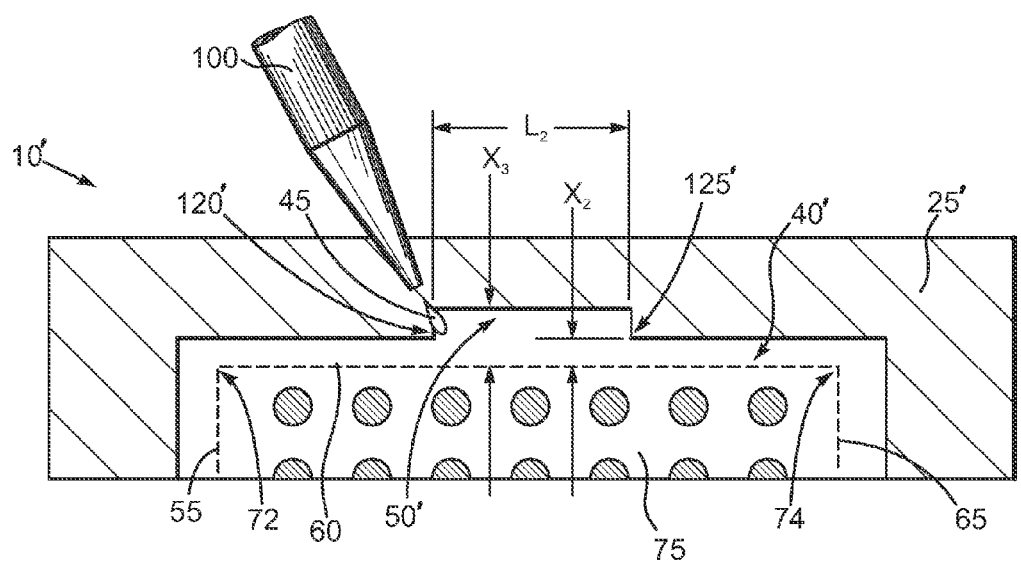
FIG. 6 is a sectional view like FIG. 5, but depicting underfill application in an alternate exemplary stiffener frame notch.

In the foregoing illustrative embodiment, an oval notch is used. However, the skilled artisan should appreciate that many different types of notch shapes may be used. In this regard, attention is now turned to FIG. 6, which is a sectional view like FIG. 5 but of an alternate exemplary embodiment of a semiconductor chip device 10' that includes a stiffener frame 25' with a rectangular notch 50'. Again the edges 55, 60 and 65 of the semiconductor chip 15 are shown in dashed since they are not actually visible in the sectional view. Like the other illustrative embodiments disclosed herein, a technical goal providing the notch 50' is to enable the dot dispensing of the underfill 45 by way of a nozzle 100. Here, the length of the notch 50' may be $L_2$, and the width, $X_3$-$X_2$, where $X_2$ is the width of the gap 40' and the dimension $X_3$ is the spacing between the edge 60 of the chip and the wall of the notch 50'. Like the other disclosed embodiments, the values for $L_2$, $X_2$ and $X_3$ may be varied depending upon the requirements of the chip device 10'. In an exemplary embodiment, $L_2$ may be 10 millimeters, $X_2$ may be 1.5 millimeters and $X_3$ may be 2.75 millimeters. Like the other disclosed embodiments, the notch 50' provides a vessel to enable the dot dispensing of the underfill 45 as well as a surface tension retention structure by way of the corners 120' and 125'. In this way, the underfill 45 is encouraged to proceed more rapidly into the interior portion 75 than around the corners 72 and 74.

Figure 7:
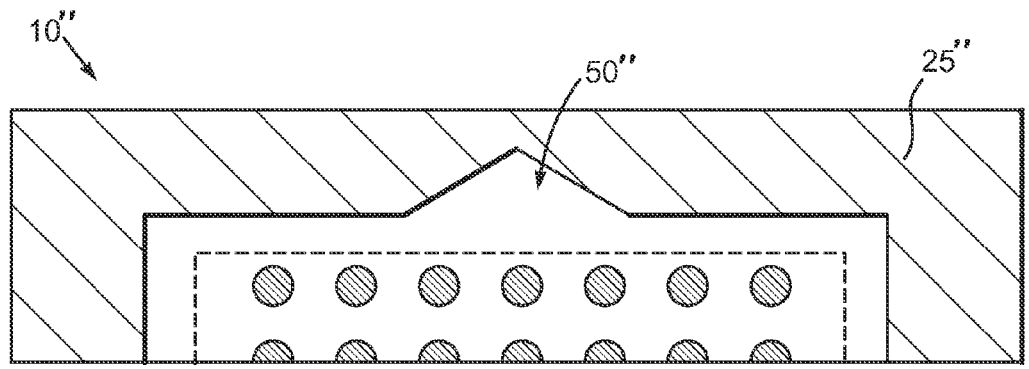
FIG. 7 is a sectional view like FIG. 6, but depicting another alternate exemplary stiffener frame and notch.
Figure 8:
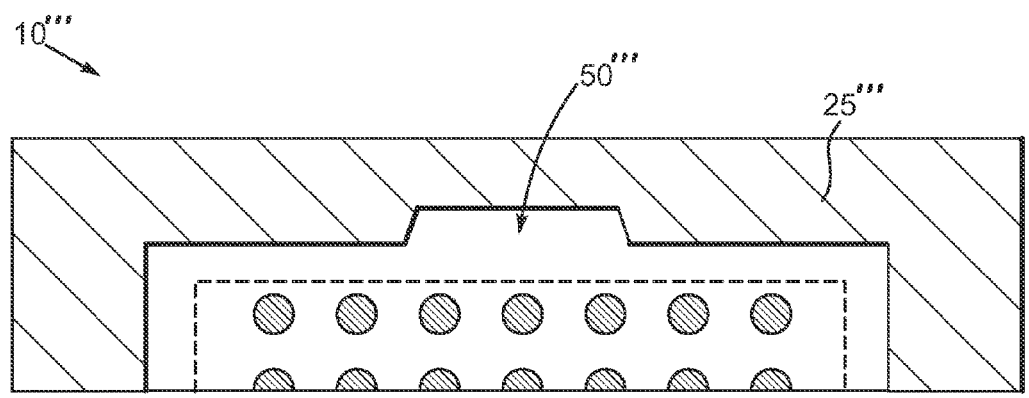
FIG. 8 is a sectional view like FIG. 7, but depicting another alternate exemplary stiffener frame and notch.

The skilled artisan will appreciate that many different types of shapes may be used for the stiffener frame notch. As shown in FIG. 7, a semiconductor chip device 10" may include a stiffener frame 25" with a triangular notch 50". As shown in FIG. 8, a semiconductor chip device 10'" may include a stiffener frame 25'" with a trapezoidal notch 50'".

Figure 9:
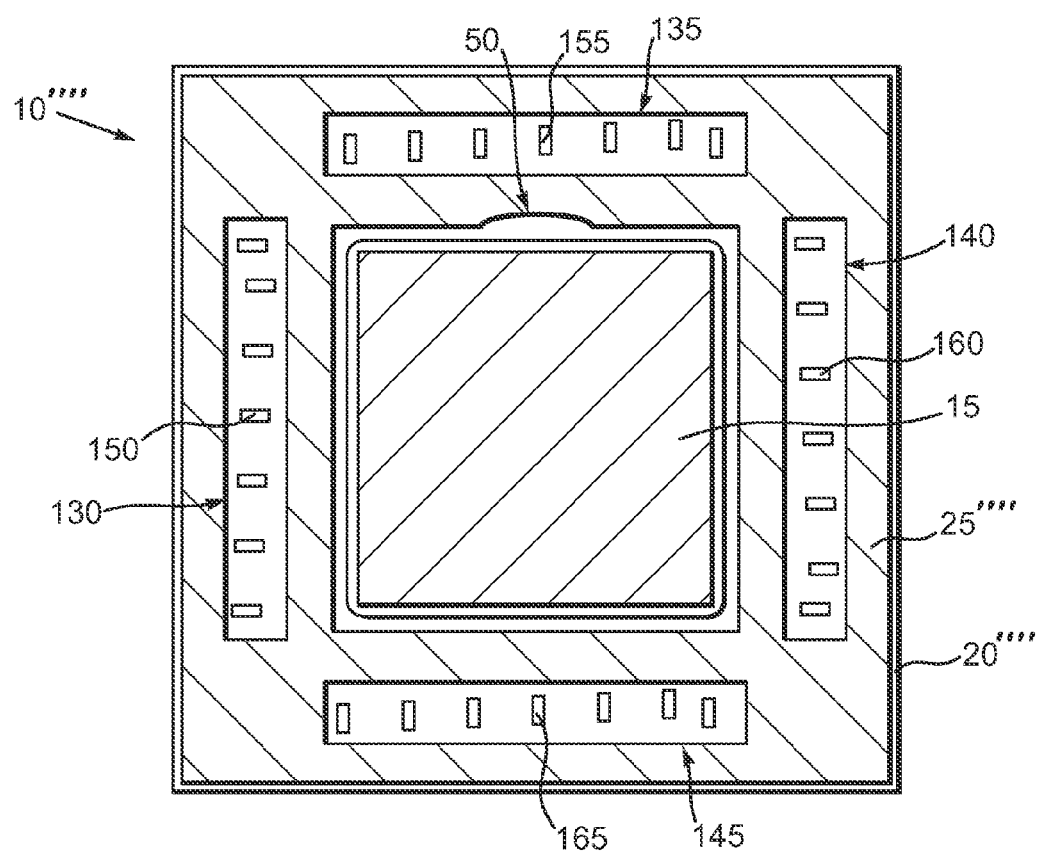
FIG. 9 is a sectional view like FIG. 2, but depicting an alternate exemplary stiffener frame.

Some embodiments of a circuit board may include surface mounted electrical components, such as capacitors, inductors or the like. Any of the disclosed embodiments of the stiffener frame may be provided with openings to accommodate the presence of such devices. In this regard, attention is now turned to FIG. 9, which is a sectional view like FIG. 2 but of an alternate exemplary embodiment of a semiconductor chip device 10"" which may be configured substantially as described above in conjunction with the semiconductor chip device 10 and depicted in FIGS. 1, 2 and 3 with a couple of notable differences. In this illustrative embodiment, the circuit board 20'''' upon which the semiconductor chip 15 is mounted may include a stiffener frame 25'''' that not only includes a notch 50 but also plural openings 130, 135, 140 and 145 that are designed to accommodate respective pluralities 150, 155, 160 and 165 of electrical components. The openings 130, 135, 140 and 145 may be formed by molding or by laser cutting, etching or other material removal processes as desired. Here, the notch 50 is depicted as an oval, but may be virtually any shape as noted elsewhere herein. Of course, a single electrical component could be used.

Figure 10:
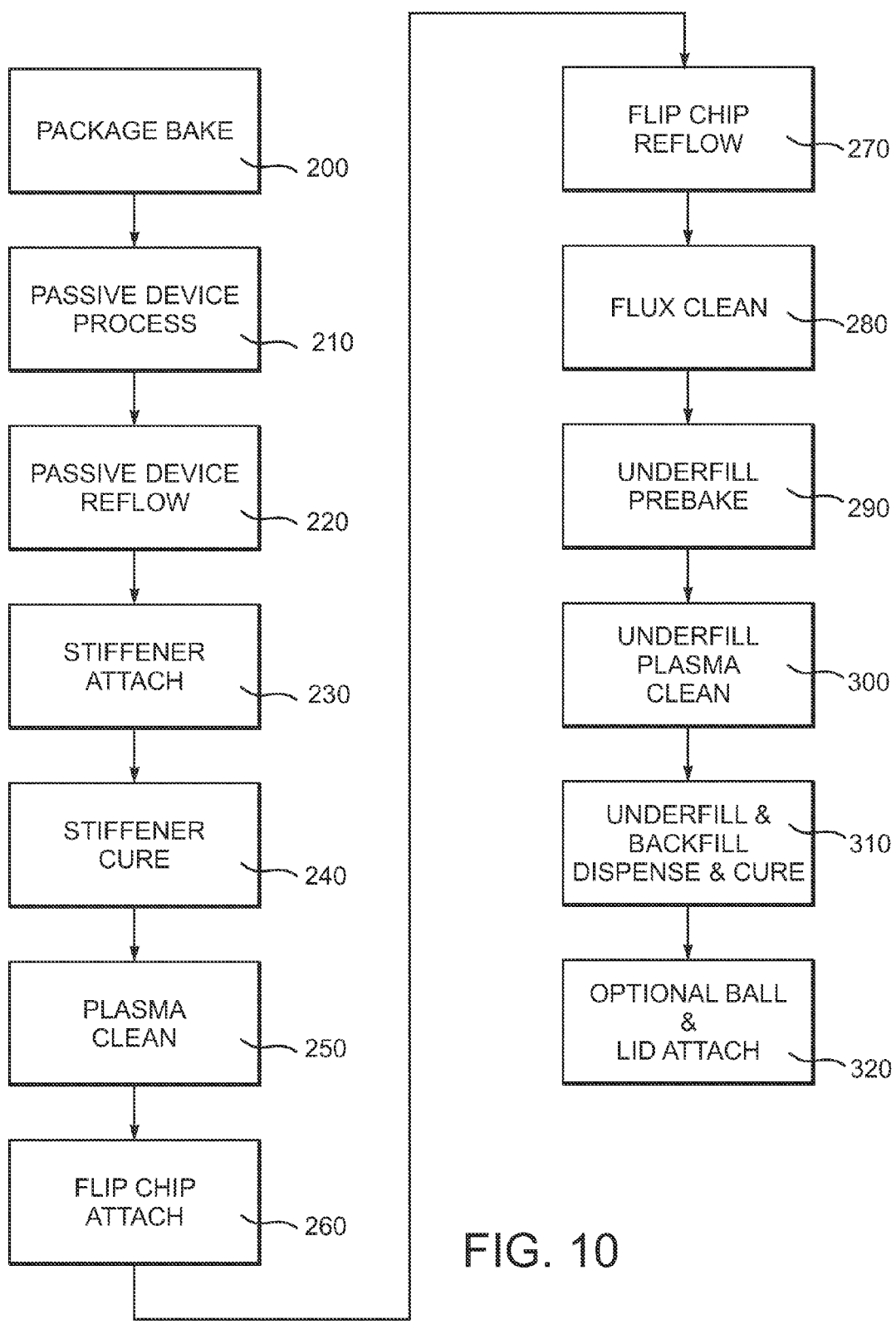
FIG. 10 is a flow chart of an exemplary process for assembling an exemplary circuit device.

An exemplary process flow for assembling a semiconductor chip device, such as the device 10 depicted in FIGS. 1-4, may be understood by referring now to FIG. 10, which is a flow chart depicting exemplary process steps. FIG. 10 depicts process flow steps in conjunction with an embodiment of a semiconductor chip device 10 where the circuit board may be a semiconductor chip package and solder joints may be used as the chip to circuit board interconnects. The steps described may be altered as necessary to implement any of the disclosed alternatives. At step 200, a package bake process is performed. At step 210, a passive device process may be performed. In this regard, the various passive devices may be positioned on a circuit board. Next, and at step 220, a passive device reflow process is performed to reflow the solder connections between the passive devices and the circuit board. At step 230, the stiffener frame may be attached to the circuit board. Here, the stiffener attachment may involve either a molding or an adhesive attachment of a previously manufactured stiffener frame to the circuit board. Next at step 230, a stiffener cure process is performed which may entail a heating process to cure a molded or adhesive attached stiffener. The curing process may be thermal or by light curing depending upon the characteristics of the stiffener. Next and at step 250, a plasma cleaning process is performed. At step 260, a flip-chip attach process is performed to position the semiconductor chip proximate the circuit board. At step 270, a flip-chip reflow process is performed to reflow and establish the solder joints between the semiconductor chip 15 and the circuit board 20. At step 280, a flux cleaning process is performed to remove any residual flux. At step 290, an underfill prebake process is performed to liberate any contaminants which might inhibit the adhesion of underfill to either the semiconductor chip and/or the circuit board. Following the underfill prebake at step 290, an underfill plasma cleaning process at step 300 may be performed to further purify the surfaces where underfill will adhere. At step 310, an underfill and if desired a backfill dispense and cure process may be performed. In this regard, the underfill may be dot dispensed as described herein with or without additional line dispensing. The underfill cure may include a heating process for about 30 to 180 minutes at about 100 to 170 C°. These parameters may be varied depending on underfill chemistry. Finally at step 320, an optional solder ball and lid attach process may be performed. As noted above, the formation of interconnects such as a ball grid array or pin grid array and the application of a lid or heat spreader are optional processes that may be performed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
providing a circuit board;
coupling a stiffener frame to the circuit board, the stiffener frame including a first opening defining an interior wall, the interior wall including a notch;
placing a semiconductor chip in the first opening and coupling the semiconductor chip to the circuit board; and
first dispensing an underfill material in the notch and thereafter allowing the underfill material to move between the semiconductor chip and the circuit board.

2. The method of claim 1, wherein the coupling the stiffener frame comprises molding a moldable material to the circuit board.

3. The method of claim 1, wherein the coupling the stiffener frame comprises applying an adhesive between the stiffener frame and the circuit board.

4. The method of claim 1, wherein the circuit board includes at least one electrical component, the method comprising forming a second opening in the stiffener frame to accommodate the at least one electrical component.

5. The method of claim 1, wherein the notch comprises an oval, a rectangular, a trapezoidal or a v-shaped footprint.

6. A method of manufacturing, comprising:
coupling a stiffener frame to a semiconductor chip package substrate, the stiffener frame including a first opening defining an interior wall, the interior wall including a notch; and
first dispensing an underfill material in the notch and thereafter allowing the underfill material to move between the semiconductor chip package substrate and a semiconductor chip in the first opening and coupled to the semiconductor chip package substrate.

7. The method of claim 6, comprising forming plural solder joints between the semiconductor chip and the semiconductor chip package substrate.

8. The method of claim 6, wherein the coupling the stiffener frame comprises molding a moldable material to the semiconductor chip package substrate.

9. The method of claim 6, wherein the coupling the stiffener frame comprises applying an adhesive between the stiffener frame and the semiconductor chip package substrate.

10. The method of claim 6, wherein the semiconductor chip package substrate includes at least one electrical component, the method comprising forming a second opening in the stiffener frame to accommodate the at least one electrical component.

11. The method of claim 6, wherein the notch comprises an oval, a rectangular, a trapezoidal or a v-shaped footprint.

12. An apparatus, comprising:
a circuit board; and
a stiffener frame coupled to the circuit board, the stiffener frame including a first opening defining an interior wall, the interior wall including a notch having a length along the interior wall and a width into the interior wall wherein the length is greater than the width.

13. The apparatus of claim 12, comprising a semiconductor chip positioned in the first opening and coupled to the circuit board.

14. The apparatus of claim 12, wherein the stiffener frame is molded to the circuit board.

15. The apparatus of claim 12, wherein the stiffener frame is coupled to circuit board by an adhesive.

16. The apparatus of claim 12, wherein the circuit board includes at least one electrical component and the stiffener includes a second opening to accommodate the at least one electrical component.

17. The apparatus of claim 12, wherein the notch comprises an oval, a rectangular, a trapezoidal or a v-shaped footprint.

18. The apparatus of claim 12, wherein the circuit board comprises a semiconductor chip package substrate.

19. A method of manufacturing, comprising:
providing a circuit board, the circuit board including at least one electrical component; and
coupling a stiffener frame to the circuit board, the stiffener frame including a first opening and a second opening, the first opening defining an interior wall having a notch, the second opening to accommodate the at least one electrical component.

20. A method of manufacturing, comprising:
providing a circuit board; and
coupling a stiffener frame to the circuit board, the stiffener frame including a first opening defining an interior wall, the interior wall including a notch having a length along the interior wall and a width into the interior wall wherein the length is greater than the width.

* * * * *